United States Patent [19]
Hälg et al.

[11] Patent Number: 4,970,411
[45] Date of Patent: Nov. 13, 1990

[54] ARRANGEMENT FOR IMPROVING THE LONGTERM STABILITY OF A HALL ELEMENT

[75] Inventors: Beat Hälg, Zug; Jacob De Vries, Allenwinden; Beat Furrer, Mettmenstetten, all of Switzerland

[73] Assignee: LGZ Landis & Gyr Zug AG, Zug, Switzerland

[21] Appl. No.: 340,274

[22] Filed: Apr. 19, 1989

[30] Foreign Application Priority Data

Apr. 21, 1988 [CH] Switzerland ............... 1504/88

[51] Int. Cl.$^5$ ............ H03K 3/59; G01R 33/06
[52] U.S. Cl. .................. 307/309; 307/491; 324/225; 324/252; 357/27
[58] Field of Search ........... 307/309, 491; 328/160; 357/27; 324/208, 225, 251, 252

[56] References Cited

U.S. PATENT DOCUMENTS

| | | | |
|---|---|---|---|
| 3,816,766 | 6/1974 | Anselmo et al. | 307/309 |
| 4,292,582 | 9/1981 | Hino | 307/309 |
| 4,339,715 | 7/1982 | Bloodworth et al. | 307/309 |
| 4,752,733 | 6/1988 | Petr et al. | 307/309 |
| 4,760,285 | 7/1988 | Nelson | 307/309 |

FOREIGN PATENT DOCUMENTS

400507  7/1967  Australia ............... 307/309

Primary Examiner—John Zazworsky
Attorney, Agent, or Firm—Marmorek, Guttman & Rubenstein

[57] ABSTRACT

An arrangement which eliminates or reduces the negative influence of small variations in the charge-carrier concentration of a semiconductor material upon the longterm stability of a magnetic field sensor such as a Hall element is disclosed. In an illustrative embodiment, the arrangement comprises a magnetic field sensor, a voltage/current converter which provides a supply current to the magnetic field sensor, an amplifier connected sequentially downstream of the voltage/frequency converter, and an analog/digital or voltage/frequency converter connected sequentially downstream of the amplifier. The amplifier provides a transmission ratio which is proportional to $(1+\delta n/n)$ or $(1-\delta n/n)$ where n is the carge-carrier concentration of the semiconductor material in which the magnetic field sensor is formed and $\delta n$ is a variation in time of the charge-carrier concentration n. The amplifier comprises an inverting amplifier which is formed using an operational amplifier, a feedback resistor and an input resistor. The amplification factor of the amplifier is proportional to the ratio of the resistance values of the two resistors which are incorporated by diffusion in a semiconductor body near the magnetic field sensor. The charge-carrier concentration in one of the two resistors is preferably identical to the charge-carrier concentration (n) in the magnetic field sensor and the charge-carrier concentration in the other resistor is equal to a multiple of the charge-carrier concentration (n). The factor $(1+\delta n/n)$ or $1-\delta n/n)$ compensates for changes in the output voltage of the magnetic field sensor resulting from the variations in the charge-carrier concentration in the magnetic field sensor.

16 Claims, 3 Drawing Sheets

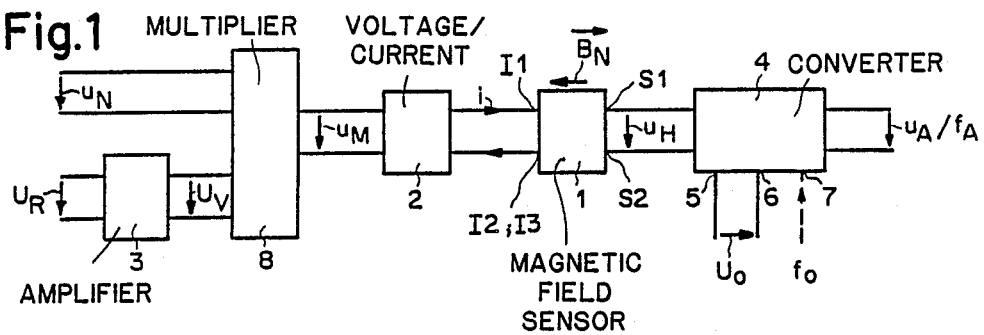
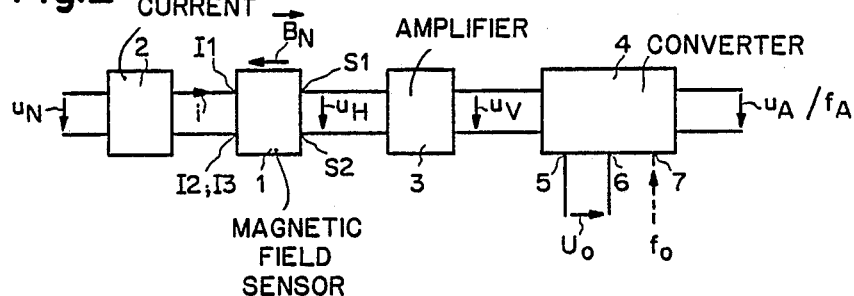
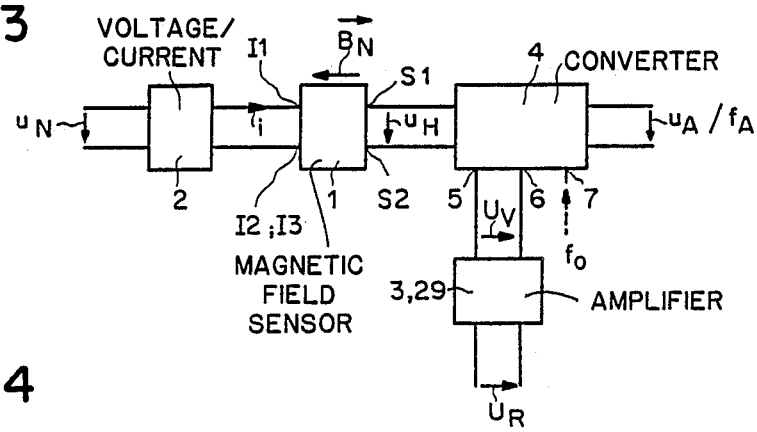
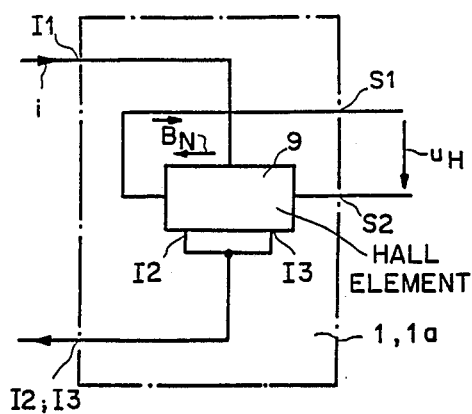
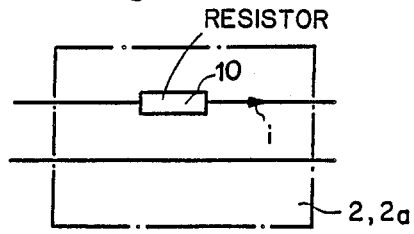

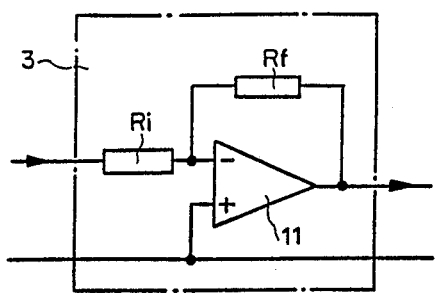
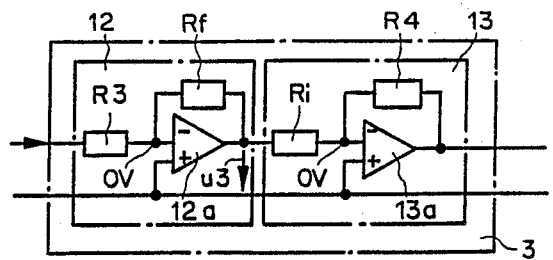
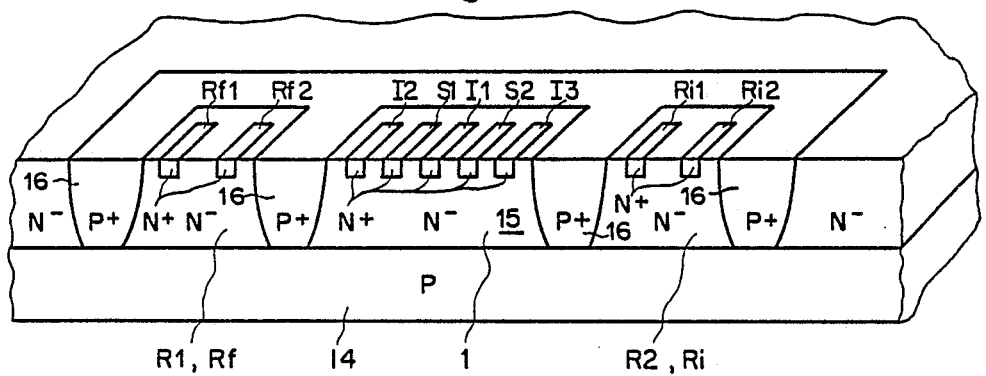
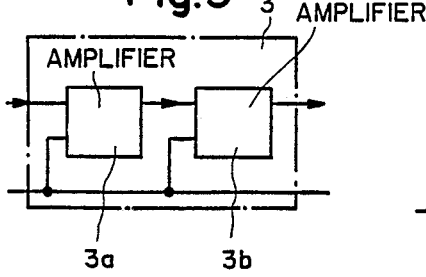
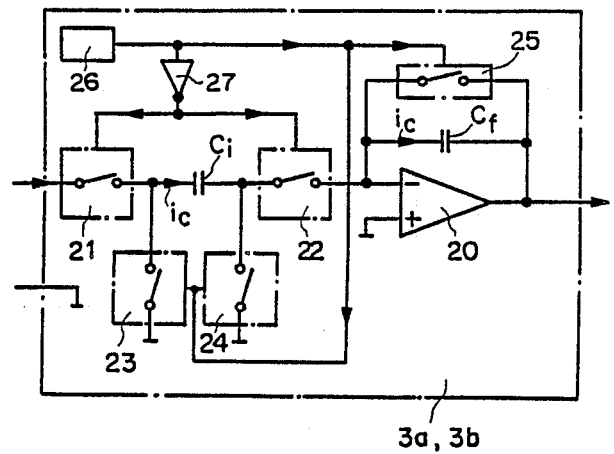

ARRANGEMENT FOR IMPROVING THE LONGTERM STABILITY OF A HALL ELEMENT

FIELD OF THE INVENTION

The present invention relates to an arrangement for improving the longterm stability of a magnetic field sensor made of a semiconductor material such as a Hall element.

BACKGROUND OF THE INVENTION

Such arrangements are used in wattmeters for example, or in electricity counters to form a voltage/current product $u_N \cdot i_N$ or, while the voltaqe $u_N$ is kept constant, to measure an electric current $i_N$. In this case $u_N$ preferably designates the supply voltage of an electrical power network and $i_N$ the electric current consumed by a user of electric energy. Since the current $i_N$ is proportional to a magnetic field induction $B_N$ which it produces, the magnetic field sensor measures the current $i_N$ indirectly when it measures the magnetic field induction $B_N$. Since the output voltage $u_H$ of a Hall element used as a magnetic field sensor is proportional to the product $i \cdot B_N$, where i is the supply current of the Hall element, the Hall element also provides the voltage/current product $u_N \cdot i_N$ when the supply current i of the Hall element is produced in proportion to the network voltage $u_N$ by means of a voltage/current converter.

When magnetic field sensors are used in precision instruments, the requirements for their longterm stability are correspondingly high, and such longterm stability cannot be taken for granted when incorporation in an integrated circuit is involved. Among other factors, small changes in the charge-carrier concentration of the semiconductor material affects the longterm stability of a magnetic field sensor made of a semiconductor material.

The changes in charge-carrier concentration of the semiconductor material of a magnetic field sensor, e.g. due to "traps" in the energy bandgap, influence the output voltage of the magnetic field sensor directly and thereby its longterm stability. Any introduction of impurities in one of the manufacturing processes can produce charge-carriers in the sensitive area of the magnetic field sensor through subsequent diffusion of ions into that area and can lead to a change of the magnetic field sensor's sensitivity. No solution has been provided up to now concerning the reduction of the negative influence of the above-mentioned effects on the longterm stability.

In view of the above, it is an object of the present invention to provide an arrangement which eliminates or at least greatly reduces the negative influence of small variations in the charge-carrier concentration of the semiconductor material upon the longterm stability of a magnetic field sensor.

SUMMARY OF THE INVENTION

The present invention is an arrangement which eliminates or reduces the negative influence of small variations in the charge-carrier concentration of a semiconductor material upon the longterm stability of a magnetic field sensor such as a Hall element. In an illustrative embodiment, the arrangement comprises a magnetic field sensor, a voltage/current converter which provides a supply current to the magnetic field sensor, an amplifier connected sequentially downstream from the magnetic field sensor, and an analog/digital or voltage/frequency converter connected sequentially downstream of the amplifier. The amplifier provides a transmission ratio which is proportional to $(1 + \delta n/n)$ or $(1 - \delta n/n)$ where n is the charge-carrier concentration of the semiconductor material in which the magnetic field sensor is formed and $\delta n$ is a variation in time of the charge-carrier concentration n. Illustratively, the amplifier comprises an inverting amplifier which is formed using an operational amplifier, a feedback resistor and an input resistor. The amplification factor of the amplifier is proportional to the ratio of the resistance values of the two resistors which may be incorporated by diffusion in a semiconductor body near the magnetic field sensor. The charge-carrier concentration in one of the two resistors is preferably identical to the charge-carrier concentration (n) in the magnetic field sensor and the charge carrier concentrate in the other resistor is equal to a multiple of the charge-carrier concentration (n). The factor $(1 + \delta n/n)$ or $(1 - \delta n/n)$ compensates for changes in the output voltage of the magnetic field sensor resulting from the variations in the charge-carrier concentration in the magnetic field sensor.

BRIEF DESCRIPTION OF THE DRAWING

FIG. 1 shows a circuit block diagram of a first embodiment of an arrangement for improving the longterm stability of a magnetic field sensor according to the invention.

FIG. 2 shows a circuit block diagram of a second embodiment of an arrangement for improving the longterm stability of a magnetic field sensor according to the invention.

FIG. 3 shows a circuit block diagram of a third and fourth embodiment of an arrangement for improving the long term stability of a magnetic field sensor according to the invention.

FIG. 4 schematically illustrates a vertical Hall element.

FIG. 5 schematically illustrates a voltage/current converter.

FIG. 6 shows a diagram of a first embodiment of an amplifier.

FIG. 7 shows a diagram of a second embodiment of the amplifier.

FIG. 8 schematically illustrates the construction of a vertical Hall element and of its two amplifier resistors.

FIG. 9 shows a circuit block diagram of a third embodiment of the amplifier.

FIG. 10 shows a diagram of an amplifier formed using switched capacitors.

Figure 11:
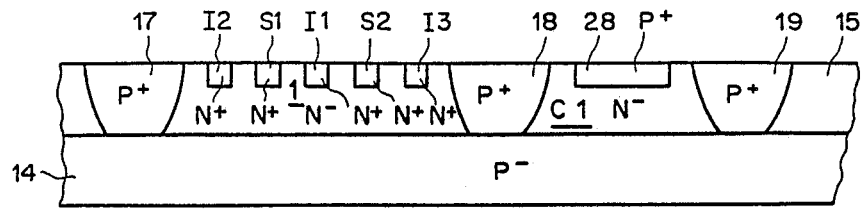
FIG. 11 shows a cross-section through a structure comprising a vertical Hall element and of a resistive layer capacitor.

The schematic representations shown in FIGS. 8 and 11 are intended only to show the relative spacial position of the components. In particular, no connections, contacts, wiring and cover layers are shown.

It has always been assumed in the drawing that the magnetic field sensor is a Hall element.

DETAILED DESCRIPTION OF THE INVENTION

The magnetic field sensor is exposed in each embodiment of the arrangement of the invention to a magnetic field induction $B_N$ to be measured which is proportional to the current $i_N$. The magnetic field sensor preferably comprises N-doped material. Assuming that the magnetic field sensor is a Hall element, its output voltage is equal to the Hall voltage:

$u_H(n) = (k/n) \cdot i \cdot B_N$, where $k = (g \cdot s)/(e \cdot d)$, and (k/n): Hall constant, n: Charge-carrier concentration of the semiconductor material of which the magnetic field sensor is made, i.e. concentration of electrons of the Hall element made of N-type doped semiconductor material, g: Geometry factor of the Hall element, s: Hall dispersion factor (nearly equal to 1)

e: Charge of an electron d: Thickness of the Hall element in the direction of magnetic field induction $B_N$.

When the charge-carrier concentration of the magnetic field sensor changes in time from n to $n + \delta n$, the Hall voltage assumes a new value:

$$u_H(n + \delta n) = [k/(n + \delta n)] \cdot i \cdot B_N = \quad (I)$$
$$[n/(n + \delta n)] \cdot (k/n) \cdot i \cdot B_N = [1/(1 + \delta n/n)] \cdot u_H(n)$$

Since the desired output signal of the arrangement according to the invention is proportional to the output voltage of the magnetic field sensor and therefore proportional to the drifting Hall voltage $u_H(n + \delta n)$, multiplication by a correction factor which is proportional $(1 + \delta n/n)$ is required in all embodiments of the invention in order to compensate for the longterm deviation of the Hall voltage. In that case the desired output signal of the arrangement is independent of $\delta n/n$. A signal used in producing the desired output signal of the arrangement is transmitted for that purpose in the arrangement via a correction mechanism to the output of the arrangement. In the two first embodiments (FIGS. 1, 2) and in the fifth embodiment of the invention, (FIG. 13) the correction mechanism has a transmission ratio which is proportional to the factor $(1 + \delta n/n)$, and in the third and fourth embodiments (FIG. 3) a transmission ratio proportional to the factor $(1 - \delta n/n)$.

In the first three embodiments of the invention (see FIGS. 1 to 3) the arrangement according to the invention comprises in each case at least one magnetic field sensor 1, one voltage/current converter 2, one amplifier 3 and one converter 4 downstream of the magnetic field sensor 1. The correction mechanism of the first three embodiments is the amplifier 3 with an amplification factor, in the first two embodiments, proportional to the factor $(1 + \delta n/n)$ and in the third embodiment proportional to the factor $(1 - \delta n/n)$.

The converter 4 used in all the embodiments of the arrangement according to the invention is in each case either an analog/digital converter or a voltage/frequency converter. The output voltage $u_A$ of the converter 4 is always also the output voltage of the arrangement according to the invention. The desired output signal of the arrangement which is proportional to the output voltage $u_H$ of the magnetic field sensor 1 is therefore also either a digital output value of the output voltage $u_A$ of the converter 4 in case that it is an analog/digital converter, or an output frequency $f_A$ of the converter 4 in case that it is a voltage/frequency converter. The converter 4 has a two-pole reference voltage input 5; 6 and, in case that it is a voltage/frequency converter, in addition a reference frequency input 7. In case that the converter 4 is a voltage/frequency converter, it is assumed for the time being that its reference frequency input 7 is supplied with a constant reference frequency $f_o$. The internal construction of the converter is not described in further detail below because analog/digital converters and voltage/frequency converters are known and common components in electronics which are known to every person schooled in the art and are commercially obtainable.

In the first three embodiments, a voltage $u_M$ (see FIG. 1) or a network voltage $u_N$ (see FIGS. 2 and 3) is transmitted via two poles to a voltage input of the voltage/current converter 2. The current output of the voltage/current converter 2 is in turn connected via two poles to a supply current input I1; I2; I3 of the magnetic field sensor 1. The voltage $u_M$ or the network voltage $u_N$ is transformed in the voltage/current converter 2 into a proportional current i which feeds the magnetic field sensor.

In the first embodiment shown in FIG. 1, the output S1; S2 of the magnetic field sensor 1 is connected via two poles directly to a signal input of the converter 4, the reference voltage input 5; 6 of which is supplied with a constant reference voltage $U_O$. The input of the amplifier 3 is under a constant reference voltage $U_R$, while its output is connected via two poles to a first input of a multiplier 8 whose second input is supplied by the network voltage $u_N$. The output voltage of the amplifier 3 is designated with the reference $U_V$. The earlier-mentioned voltage $u_M$ is the output voltage of the multiplier 8 and therefore is equal to the product $u_N \cdot U_V$ of its two input voltages. The output of the multiplier 8 is thus connected via the voltage/current converter 2 to the supply current input I1; I2; I3 of the magnetic field sensor 1. The multiplier 8 is a know component which is commercially obtainable.

In the second embodiment shown in FIG. 2, the output S1; S2 of the magnetic field sensor 1 is connected via two poles to the input of the amplifier 3 whose output goes in turn via two poles to the signal input of the converter 4. The amplifier 3 is thus connected in series downstream of the magnetic field sensor 1. The reference voltage input 5; 6 of the converter 4 is again under constant reference voltage $U_O$.

In the third embodiment shown in FIG. 3 the output S1; S2 of the magnetic field sensor 1 is connected directly via two poles to the signal input of the converter 4 whose reference voltage input 5; 6 is in this case connected to the output of the amplifier 3 whose input is under the constant reference voltage $U_R$.

In the first embodiment (FIG. 1) the amplifier 3 is installed as a correction mechanism in a supply current input circuit 2; 3; 8 of the magnetic field sensor 1 in such manner that the supply current i of the magnetic field sensor is multiplied by a factor which is proportional to the factor $(1 + \delta n/n)$. In this case the output voltage $U_V$ of the amplifier 3 is indeed proportional to $(1 + \delta n/n) \cdot U_R$ and the supply current i is thereby proportional to the product $u_N \cdot (1 + \delta n/n)$.

In the second embodiment (FIG. 2) the multiplication takes place at the output of the magnetic field sensor 1 in that its output voltage $u_H$ is multiplied by the amplification factor of the amplifier 3 which is connected directly downstream of the magnetic field sensor 1. The amplification factor is $(1+\delta n/n)$.

In the first two embodiments, the input voltage of the converter 4 is thus, while taking into account the equation I, proportional to the value:

$$u_H(n+\delta n)\cdot(1+\delta n/n) = [1/(1+\delta n/n)]\cdot u_H(n)\cdot(1+\delta n/n) = u_H(n),$$

which is, as desired, independent of the change $\delta n$ of the charge-carrier concentration n in the magnetic field sensor 1.

When the converter 4 is an analog/digital converter, the digital output value of the output voltage $u_A$ of the converter 4 which is then without dimension is proportional to the input voltage of the converter 4 expressed in volts, whereby the proportionality factor has the dimension 1/volt and is itself inversely proportional to the reference voltage $U_O$ at the reference voltage input 5; 6 of the converter 4 (see FIGS. 1 and 2) or $U_V$ (see FIG. 3). In other words: the proportionality factor is proportional to $1/U_O$ in the first two embodiments and is proportional to $1/U_V$ in the third embodiment.

If, on the other hand, the converter 4 is a voltage/frequency converter, its output frequency $f_A$, which has a dimension 1/second, is proportional to the input voltage, expressed in volts, of the converter 4, with the proportionality factor having this time a dimension 1/(second.volt) and being itself on the one hand proportional to the reference frequency $f_O$ at the reference frequency input 7 of the converter 4 and on the other hand inversely proportional to the reference voltage $U_O$ (see FIGS. 1 and FIG. 2) or $U_V$ (see FIG. 3) at the reference voltage input 5; 6 of the converter 4. In other words, here too the proportionality factor in the first two embodiments is proportional to $1/U_O$ and is proportional to $1/U_V$ in the third embodiment. This proportionality factor is furthermore proportional to the factor $f_O$ in all embodiments. In this way, and independently of whether converter 4 is an analog/digital converter or a voltage/frequency converter, the input voltage in converter 4 is divided in the first two embodiments by the constant reference voltage $U_O$ and in the third embodiment by the output voltage $U_V$ of the amplifier 3.

Since $\delta n$ was already eliminated either at the input or at the output of the magnetic field sensor 1, as has already been explained in detail, and is therefore no longer contained in the value of the input voltage of the converter 4, and since the reference voltage $U_O$ is constant, the useful output signal of the arrangement, i.e. the digital output value if converter 4 is an analog/digital converter or the output frequency $f_A$ if the converter 4 is a voltage/frequency converter, does not depend on the change $\delta n$ in the charge-carrier concentration n in the magnetic field sensor.

In the third embodiment on the other hand, the input voltage of the converter 4 is the not-yet corrected output voltage $u_H(n+\delta n) = [1/(1+\delta n/n)]\cdot u_H(n)$ of the magnetic field sensor 1.

The correction, i.e. the multiplication by the factor $(1+\delta n/n)$ takes place in the third embodiment within the converter 4, in that the input voltage $u_H$ of the converter 4 is there divided by the output voltage $U_V$ of the amplifier 3 at the reference voltage input 5; 6. The amplifier 3 in this case does not, as mentioned earlier, have an amplification factor $(1+\delta n/n)$ but an amplification factor $(1-\delta n/n)$ so that the output voltage of the amplifier 3 has a value equal to $U_V = U_R\cdot(1-\delta n/n)$ in this case.

The input voltage $u_H$ of the converter 4 is thus divided by $(1-\delta n/n)$ in the converter 4, and with a very low value of $(\delta n/n)$ this is nearly equal to a multiplication by the factor $(1+\delta n/n)$, since $[1/(1-\delta n/n)] = (1+\delta n/n)$ as is known since $(\delta n/n)$ is small and second and higher order terms are negligibly small. Through this multiplication by the factor $(1+\delta n/n)$ the factor $[1/(1+\delta n/n)]$ contained in the value of the input voltage of the converter 4 (see equation I) is eliminated so that the useful output signal of the converter 4 is again independent of the change $\delta n$ of the charge-carrier concentration n in the magnetic field sensor 1, as in the first two embodiments.

All of the Hall elements used here can be either vertical or horizontal Hall elements. A vertical Hall element for example is described in the printed publication IEEE Electron Device Letters, Vol. EDL-5, No. 9, Sept. 84, Pages 357 and 358, "The Vertical Hall-Effect Device", R. S. Popovic, while a horizontal Hall element for example, is known from U.S. Pat. No. 4,253,107. Vertical Hall elements are Hall elements measuring magnetic fields which are active parallel to the surface of the Hall element, while horizontal Hall elements on the other hand measure magnetic fields which are vertical in relation to the surface of the Hall element. Illustratively, all the Hall elements in the described arrangements are vertical Hall elements. In that case, each of these Hall elements has three current connections I1, I2 and I3 which together constitutes its supply current input I2; I2; I3 as well as two sensor connections S1 and S2 which, in the sequence I2, S1, I1, S2 and I3, from left to right for example, are arranged parallel next to each other in the illustration of the drawing (see FIGS. 8 and 11). The two current connections I2 and I3 of the vertical Hall element which are spatially towards the outside are connected to each other either via a resistor for each or, as shown in FIG. 4 for a vertical Hall element 9, directly, whereby a common connection point I2; I3 thus produced constitutes one of the two poles of the supply current input I1; I2; I3. A supply current i of the Hall element 1 delivered by the voltage/current converter 2 therefore flows into the Hall element at the current connection I1 for example and divides within it, whereby the divided currents leave the Hall element at the current connections I2 and I3 to be then added together again, making up total value of the supply current i. The sensor connections S1 and S2 constitute the bipolar output of the Hall elements which are under the Hall voltage $u_H$, whereby the sensor connection S2 can be grounded either virtually or directly. An output pole of the Hall element can be grounded virtually by connecting it as an actual value pole to an inverting input of an amplifier (not shown) which functions as a variable gain amplifier and at whose non-inverting input a constant reference voltage is applied as the desired value, being equal to zero Volts in the ideal case, while the output of this variable gain amplifier is connected to a pole, e.g. I2; I3 of the supply current input of the magnetic field sensor 1.

The voltage/current converter 2 comprises preferably one single resistor 10 and in that case its construction is as shown in FIG. 5. In this case the resistor 10 is located between a first pole of the voltage input and a first pole of the voltage output of the voltage/current converter 2, while the second poles of this voltage input or current output are each connected directly to the other.

In the first three embodiments, the amplifier 3 has preferably the construction shown in one of the three FIGS. 6, 7 or 9.

In the construction shown in FIG. 6, the amplifier has an amplification factor which is proportional to a ratio Rf/Ri of the resistance values of two resistors Rf and Ri incorporated by diffusion which, as FIG. 8 shows, are diffused near the magnetic field sensor 1 symmetrically to the latter with nearly its dimensions into a semiconductor material of the same conductivity type N as that of which the magnetic field sensor 1 is made According to FIG. 6 the amplifier 3 comprises a known inverting amplifier constructed by means of an operational amplifier 11 and is provided with a feedback resistor Rf and an input resistance Ri. The input resistor Ri is here placed before the inverting input of the operational amplifier 11 within the amplifier 3 in that it is built in between a first input pole of the amplifier 3 and the inverting input of the operational amplifier 11. The feedback resistor Rf is located between this inverting input and the output of the operational amplifier 11. The non-inverting input of the operational amplifier 11 is connected either via a resistor or, as shown, directly to a second input pole of the amplifier 3 which is at the same time a first output pole of the amplifier 3. The output of the operational amplifier 11 is at the same time the second pole of the output of the amplifier 3. The amplification factor of an inverting amplifier 3 designed in this manner is known to be equal to $-(Rf/Ri)$.

While most of the other resistors can be produced according to conventional methods such as are commonly used in integrated circuits, the two resistors Rf and Ri are preferably made in form of resistors incorporated through diffusion of the same "bulk" material of which the magnetic field sensor 1 is made. Each resistor made of N-doped material is known to have a resistance value:

$R(m) = A/m$ where $A = 1/(G.e.\mu)$, and m: charge-carrier or electron concentration (doping) of the resistor, G: geometry factor of the resistor where $G = b.t/L$, electron mobility, f: an electron, e: charge of an electron, b: width of the resistor, t: depth of the resistor and L: length of the resistance.

In the first two embodiments Rf=R1 and Ri=R2 are selected, and in the third embodiment, Rf=R2 and Ri=R1 are selected.

The first resistor R1 has a charge-carrier concentration m1, a geometry factor G1 and an electron mobility $\mu 1$, so that its factor A is equal to $A1 = 1(G1.e.\mu 1)$ and its resistance value R1 is equal to $R1(m) = A1/m1$.

The second resistor R2 has a charge-carrier concentration m2=a.m1, a geometry factor G2 and an electron mobility $\mu 2$, so that its factor A is equal to $A2 = 1/(G2.e.\xi 2)$ and its resistance value R2 is equal to $R2(m) = A2/m2 = A2/(a.m1)$.

Preferably a value m1=n is selected for the resistor R1, i.e. the charge-carrier concentration m1 in the first resistor R1 is selected so as to be equal to the charge-carrier concentration n existing in the magnetic field sensor 1, so that the resistance value R1 is then equal to $R1(n) = A1/n$. Since the resistor R2 has a charge-carrier concentration a times that of resistance R1, the resistance value of resistor R2 is in this case equal to $R2(n) = A2/(an)$. The charge-carrier concentration m2 of the resistor R2 is in that case a multiple a.n of the charge-carrier concentration n existing in the magnetic field sensor 1.

As mentioned earlier, an equally great change $\delta n$ of the charge-carrier concentration n exists for all three components 1, R1 and R2, so that $\delta n = \delta m1 = \delta m2$ applies.

The resistance ratio R2/R1 has the following value at the beginning:

$(R2/R1) = (A2/m2)/(A1/m1) = (A2/A1)\cdot(m1/m2)$.

If after a certain period of time the resistor R1 assumes the charge-carrier concentration $m1 + \delta m1 = m1 + \delta n$ and the resistor R2 assumes the charge-carrier concentration $m2 + \delta m2 = m2 + \delta n$, the following applies:

$$(R2/R1) = (1/D) \cdot [(m1 + \delta n)/(m2 + \delta n)] \qquad (III)$$

where $$(1/D) = A2/A1 = (G1 \cdot e \cdot u1)/(G2 \cdot e \cdot u2) = \qquad (IV)$$
$$(G1/G2) \cdot (u1/u2).$$

The equation (III) can be reformulated as follows:

$$\begin{aligned}
(R1/R2) &= D \cdot (m2 + \delta n)/(m1 + \delta n) \\
&= D \cdot (m2/m1) \cdot [1 + (\delta n/m2)]/[1 + (\delta n/m1)] \\
&= D \cdot (m2/m1) \cdot [1 + (\delta n/m1)(m1/m2)] [1 - \\
&\quad (\delta n/m1) + (\delta n/m1)^2 - \ldots]
\end{aligned}$$

where $1/[1 + \delta n/m1)] = 1 - (\delta n/m1) + (\delta n/m1)^2 - \ldots$

Assuming that (m2/m1)=a, m1=n and considering the terms of second and higher order as negligible, the following value is obtained for the resistance ratio:

$$\begin{aligned}
(R1/R2) &= (D)(m2/m1) \cdot \{1 - (\delta n/m1) \cdot [1 - (m1/m2)]\} \qquad (V) \\
&= (a \cdot D) \cdot \{1 - [1 - (1/a)] \cdot (\delta n/n)\}.
\end{aligned}$$

Preferably $a = \frac{1}{2}$ is selected, i.e. the charge-carrier concentration in the second resistor R2 is selected equal to half the charge-carrier concentration n existing in the magnetic field sensor so that the equation (V) yields the following result:

$$\begin{aligned}
(R1/R2) &= (D/2) \cdot [1 - (1 - 2)\delta n/n] \\
&= (D/2) \cdot (1 + \delta n/n) \text{ or} \\
(R2/R1) &= (2/D) \cdot (1 - \delta n/n),
\end{aligned}$$

because $1/(1 + \delta n/n)$ is again equal to $(1 - \delta n/n)$ when n/n is very small.

The relationship between two resistors R1 and R2 with different doping thus directly yields the desired factor $([1 + \delta n/n)]$. In the first two embodiments the amplification factor of the amplifier 3 is equal to $$-(Rf/Ri) = -(R1/R2) = -(D/2)\cdot(1 + \delta n/n)$$

and thereby is proportional to $(1 + \delta n/n)$, as is wanted.

In the third embodiment on the other hand, the amplification factor is equal to $$-(Rf/Ri) = -(R2/R1) = -(2/D) \cdot (1 - \delta n/n)$$

and thus is proportional to $(1 - \delta n/n)$ as is wanted.

The geometry factors G1 and G2 of the resistors R1 and R2 which are delimited by volume charge zones may not change as a function of the voltage applied. This is true in particular for the second embodiment (see FIG. 2), in which the varying Hall voltage $u_H$ is applied at the input of the amplifier 3. Among others, the two following methods make it possible to avoid these changes Either the resistors R1 and R2 are dimensioned on a large scale by comparison with the changes of the volume charge zones and/or the selected voltages of the wells which limit the volume charge zones are high by comparison with the voltage drop of the resistors, or a circuit block diagram according to FIG. 7 in which the voltage drops u3 are equal in both resistors Ri and Rf used for the amplifier 3.

The amplifier 3 shown in FIG. 7 comprises a series connection of two inverting amplifiers 12 and 13 incorporating an operational amplifier 12a or 13a for each. The amplifiers 12 and 13 are designed in a manner nearly identical to the inverting amplifier shown in FIG. 6, with the difference that the input resistor in the first amplifier 12 of the two amplifiers is not equal to Ri but equal to a third resistance value R3, and that in the amplifier 13, the feedback resistor is not equal to Rf but equal to a fourth resistor value R4, whereby the third resistor R3 and the fourth resistor R4 are produced according to conventional methods used for integrated circuits. The amplifiers 12 and 13 thus each comprise an operational amplifier 12a or 13a, each of a feedback resistor Rf or R4 and each of an input resistor R3 or Ri. The input resistor Ri of the amplifier 13 and the feedback resistor Rf of the first amplifier 12 again have the same significance as the amplifier arrangement shown in FIG. 6.

In the first two embodiments, Rf=R1 and Ri=R2 once more, so that the first resistor R1 is installed in the form of a feedback resistor Rf between the output of the operational amplifier 12a of the first amplifier 12 and the inverting input of the operational amplifier 12a. The third resistor R3 is installed before the inverting input of the operational amplifier 12a in form of an input resistor, while the fourth resistor R4 in form of a feedback resistor is formed inbetween the output of the operational amplifier 13a of the amplifier 13 and the inverting input of the operational amplifier 13a. The second resistor R2 is installed in form of an input resistor Ri upstream of the inverting input of the operational amplifier 13a.

In the third embodiment however, Rf=R2 and Ri=R1 once more, so that this time the second resistor R2 in form of a feedback resistor Rf is installed between the output of the operational amplifier 12a of the first amplifier 12 and the inverting input of this operational amplifier 12a. The first resistor R1 however is installed in form of an input resistor Ri at the inverting input of the operational amplifier 13a.

Due to the fact that the inverting inputs of the two operational amplifiers 12a, 13a are at the same potential, an identical voltage u3 is applied to the two resistors Ri and Rf where u3 designates the output voltage of the first inverting amplifier 12.

The amplifier 3 shown in FIG. 7 has an amplification factor $(-Rf/R3) \cdot (-R4/Ri) = (Rf/Ri) \cdot (R4/R3)$.

Through an appropriate choice of the values of the resistors R3 and R4 the input signal of the amplifier 3 is amplified accordingly so that pre-amplification of the Hall voltage $u_H$ may not be necessary in the second embodiment.

The design of the embodiment of the invention shown partly in FIG. 8 contains a substrate 14 made of a P-type material on which an epitaxial layer 15 of lightly doped N-type material is applied. FIG. 8 shows schematically that the two resistors Rf and Ri on either side of the magnetic field sensor 1 are parallel and, in a top view, symmetric to the magnetic field sensor 1, whereby all three components 1, Rf and Ri are as close to each other within the N-doped material of the epitaxial layer 15 so that they are maintained at an identical temperature and are subjected to the same charge-carrier concentration change over time. The resistors Rf and Ri are furthermore symmetric in relation to the magnetic field sensor 1 so that they may be exposed to nearly identical piezo-resistance effects which later mostly disappear due to the ratio of the resistances which is produced. In order for the resistors Rf and Ri to be subjected to the same change n in charge-carrier concentration as the magnetic field sensor 1 they are desirably as close as possible in geometric size, desirably have the same depths and desirably are produced by the same method, i.e. with the same process steps in sensitive volumes as the magnetic field sensor 1.

The resistors Rf and Ri are here advantageously delimited laterally by wells 16 made of heavily doped P-type material (P wells) in the same manner as the magnetic field sensor 1 and are buried from the top under a covering layer (not shown) made of P-type material.

The connection contacts I1, I2, I3, S1 and S2 of the magnetic field sensor 1 as well as Rf1 and Rf2 of the resistor Rf and Ri1 as well as Ri2 of the resistor Ri all comprise heavily doped N-type material.

The resistor R2 preferably has the original, homogenous doping of the original material, while the magnetic field sensor 1 and the resistance R1 receive (1/a) times the doping of the original material, i.e. preferably twice the doping where $a = \frac{1}{2}$. All three components 1, R1 and R2 are here of the same doping type, e.g. of type N.

The amplifier 3 can also be designed as shown in FIG. 9. This amplifier 3 comprises two amplifiers 3a and 3b which are connected in series in the indicated sequence, whereby a single-pole output of the first amplifier 3a is connected to a first input pole of the second amplifier 3b whose single-pole output constitutes a first output pole of the amplifier 3. A first input pole of the first amplifier 3a constitutes a first input pole of the amplifier 3. The second input poles of the amplifiers 3a and 3b are connected to each other and constitute together a second input pole of the amplifier 3 which is at the same time a second output pole of said amplifier 3. The amplifiers 3a and 3b are both constructed in the same manner and are realized by means of switched capacitors Cf and Ci (see FIG. 10). Thus the amplifiers 3a and 3b are known as "switched capacitor amplifiers".

The amplifier 3a or 3b shown in FIG. 10 comprises an operational amplifier 20, a feedback capacitor Cf, an input capacitor Ci, five switches 21 to 25 which are all preferably semiconductor analog switches, an astable multivibrator 26 and an invertor 27. A first pole of the signal input of the amplifier 3a or 3b is connected to a first pole of switch 21, the second pole of which is connected to a first pole of the switch 23 and to a first pole of the input capacitor Ci. The second pole of the capacitor Ci is in turn connected to the first poles of switches 22 and 24, whereby the second pole of switch 22 is connected to the inverting input of the operational amplifier 20 as well as to the first pole of switch 25 and the first pole of the feedback capacitor Cf. The second pole of switch 25 and the second pole of the feedback capacitor Cf are connected to the output of the operational amplifier 20 which is at the same time the output of the amplifier 3a or 3b. The second poles of switches 23 and 24, the second poles of the signal input of the amplifier 3a or 3b and the non-inverting input of the operational amplifier 20 are grounded, each via a resistance or, as shown in FIG. 10, directly. The output of the astable multivibrator 26 is connected directly to a control input of the switches 23, 24 and 25 as well as via invertor 27 to the control input of the switches 21 and 22.

The astable multivibrator 26 produces a rectangular pulse signal which controls the switches 23 to 25 on the one hand and the switches 21 to 22 on the other hand in opposite synchronization, so that always only one of the two groups of switches 23, 24 and 25 or 21 and 22 are closed at one time. The pulse signal or the control signals of the two groups of switches can of course be produced externally instead of internally, and can be transmitted to the amplifier 3a or 3b via one or two separate pulse inputs (not shown). In such cases the astable multivibrator 26 and possibly also the invertor 27 can be omitted.

In a first operating phase the switches 21 to 22 are open and the switches 23 to 25 are closed, so that the input capacitor Ci can discharge via the switches 23 to 24 and the feedback capacitor Cf can discharge via switch 25 to zero volts. In a second operating phase however, the switches 21 to 22 are closed and the switches 23 to 25 are open. The input voltage of the amplifier 3a or 3b then charges the input capacitor Ci with a charge current $i_C$ via the closed switches 21 and 22 since the inverting input of the operational amplifier 20 is virtually grounded, as is known. The charge current $i_C$ continues to flow through the feedback capacitor Cf in which it produces a voltage drop equal to the output voltage of the amplifier 3a or 3b. The amplification factor of the amplifier 3a or 3b functioning as an inverting amplifier is $[-(1/\Omega.Cf)/(1/\Omega.Ci)] = (-Ci/Cf$, where $\kappa$ is the switch-over frequency of the switches 21 to 25.

The amplification factor of the series circuit 3a; 3b of the two identically constructed amplifiers 3a and 3b is $(Ci/Cf)^2$, since both of the amplifiers 3a, 3b have an amplification factor $(-Ci/Cf)$.

In the first two embodiments (FIGS. 1 and 2) the input capacitor Ci in either of the two amplifiers 3a and 3b is a resistive layer capacitor C1 and the feedback capacitor Cf is a capacitor C2 which is not a resistive layer capacitor but a conventional capacitor, e.g. one made with polysilicon and which has a capacity that is constant and independent of the charge-carrier concentration.

In the first two embodiments the amplifier 3 is therefore a series circuit of two inverting amplifiers 3a and 3b, each of which is constituted by means of an operational amplifier 20, whereby the output and the inverting input of each operational amplifier 20 are connected to each other via the second capacitor C2 which is used as a feedback capacitor Cf while a first switch 21, the resistive layer capacitor C1 used as the input capacitor Ci and a second switch 22 are connected in series in the sequence indicated and are located between one input pole of the amplifier 3a or 3b and the inverting input of its operational amplifier 20, and whereby the two poles of the input capacitor Ci may be grounded via a third or fourth switch 23 or 24 while the feedback capacitor Cf is bridged by a fifth switch 25.

In the third embodiment, the amplifier 3 is also a series circuit of two inverting amplifiers 3a and 3b each of which is made up of an operational amplifier 20, whereby the output and the inverting input of either operational amplifier 20 are in this case connected to each other via the resistive-layer capacitor C1 serving as feedback capacitor Cf while a first switch 21, the second capacitor C2 used as an input capacitor Ci and a second switch 22 are connected this time in series in the indicated sequence and are located between the input pole of the amplifier 3a or 3b and the inverting input of its operational amplifier 20, whereby the two poles of the input capacitor Ci are again grounded via a third or fourth switch 23 or 24 and the feedback capacitor Cf is bridged by a fifth switch 25.

The square of the original capacity value of the two identically formatted resistive-layer capacitors C1 of the two amplifiers 3a and 3b has the value $$C1^2(m) = K \cdot m \qquad (VI),$$

Where
- m: charge-carrier concentration (doping) of the capacitor C1 comprising N-doped semiconductor material,
- $\beta$: dielectric constant of the semiconductor material,
- e: charge of one electron,
- V: voltage of the resistive layer capacitor,
- $V_{bi}$: Built-in voltage of approximately 0.6 volt of the resistive layer capacitor and
- K: $(e.\beta).(V-V)/2$ With the passage of time the charge-carrier concentration n of the magnetic field sensor 1 again assumes the value $n + \delta n$ and the charge-carrier concentration m of the resistive-layer capacitors C1 assumes a value $m + \delta m = m + \delta n$, where $\delta m = \delta n$, so that the square of the capacity of the resistive-layer capacitors C1 assumes the following new value (see equation VI):

$$C1^2(m+\delta m) = K \cdot (m + \delta n) = K \cdot m \cdot [1 + (n/m)(\delta n/n)]$$

The charge-carrier concentration m in the resistive-layer capacitors C1 is preferably equal to the charge-carrier concentration n in the magnetic field sensor 1, i.e. m=n.

In that case the amplification factor of the amplifier 3 has the following value in the first two embodiments:

$$(Ci/Cf)^2 = (C1/C2)^2 = (K \cdot m/C2^2) \cdot (1 + \delta n/n)$$

The uncompensated output voltage $u_H(n + \delta n)$ of the magnetic field sensor 1 is in both of the first two embodiments multiplied by the amplification factor of the amplifier 3 and thereby multiplied with a correction factor proportional to $(1 + \delta n/n)$. The input voltage of the converter 4 (see F161 and F162) is then:

$$u_H(n + \delta n) \cdot (Ci/Cf)^2 =$$
$$[1/(1 + \delta n/n)] \cdot u_H(n) \cdot (K \cdot m/C2^2) \cdot (1 + \delta n/n) =$$
$$u_H(n) \cdot (K \cdot m/C2^2),$$

and is therefore, as desired, independent of the change $\delta n$ of the charge-carrier concentration n in the magnetic field sensor 1.

In the third embodiment of the arrangement according to the invention however, the amplification factor of the amplifier 3 has then a value of $$(C_i/C_f)^2 = (C_2/C_1)^2 = (C_2^2/K \cdot m)/(1+n/n)$$

In the third embodiment it is known that the input signal of the converter 4 is divided by the output voltage $U_V$ of the amplifier 3. As a result this input signal is multiplied here too by a correction factor which is proportional to $(1+n/n)$.

The desired output signal of the converter 4 and therewith the desired output signal of the arrangement according to the invention is again independent of any changes n of the charge-carrier concentration n of the magnetic field sensor 1.

As to the construction of the capacitors Ci and Cf as well as of the magnetic field sensor 1, the same rules and the same conditions apply in principle as in the construction of the two resistors Ri and Rf as well as of the magnetic field sensor 1. In particular, FIG. 8 applies on condition that the resistances Ri and Rf are replaced by the capacitors C1 of the two amplifiers 3a and 3b. Near the magnetic field sensor 1, at least the resistive-layer capacitors C1 are thus diffused into a semiconductor material of the same conductivity type N as that of which the magnetic field sensor is made. A simplified cross-section of a possible format of the magnetic field sensor 1 and of one of the capacitors is shown in FIG. 11. An epitaxial layer 15 is applied on a substrate 14 which can be made of such material as lightly doped P-type material, said layer comprising for instance of lightly doped N-type material. The magnetic field sensor 1 and the capacitors C1 are located within the epitaxial layer 15. Between the magnetic field sensor 1 and the capacitors C1 as well as between these components and the adjoining epitaxial layer 15 a well 17, 18 or 19 made of heavily doped P-type material is diffused into the epitaxial layer 15 for insulation purposes. The resistive-layer capacitors C1 are made of a heavily doped P-type material layer 28 which is diffused into the surface of the epitaxial layer 15. FIG. 11 also shows the connections I2, S1, I1, S2 and I3 of the vertical Hall elements which constitutes the magnetic field sensor 1. These connections are all made of a heavily doped diffusions of N-type material incorporated by diffusion into the surface of the epitaxial layer 15.

The fourth embodiment of the arrangement according to the invention is formatted similarly to the third embodiment with the difference that the amplifier 3 is replaced by an additional magnetic field sensor circuit 29 (see FIG. 3). The magnetic field sensor circuit 29 is the correction mechanism of the fourth embodiment.

Figure 12:
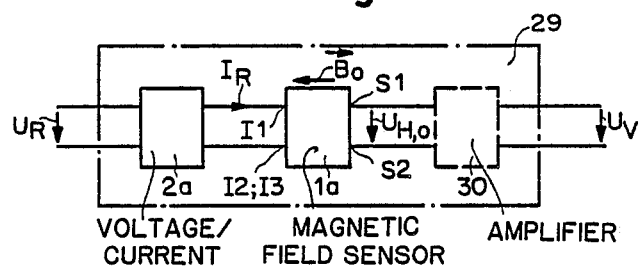
FIG. 12 shows a circuit block diagram of another magnetic field sensor circuit.

The magnetic field sensor circuit 29 shown in FIG. 12 in turn contains a second magnetic field sensor 1a, an additional voltage/current converter 2a and an optional voltage amplifier 30, whereby the magnetic field sensor 1a and the voltage/current converter 2a are again preferably a Hall element or a resistor 10, both having the format shown in FIGS. 4 and 5.

The magnetic field sensor 1a, which may be a vertical Hall element, and the voltage/current converter 2a are connected to each other as is the magnetic field sensor 1 to the voltage/current converter 2. The voltage input of the voltage/current converter 2a is connected via two poles to a constant reference voltage $U_R$ while its current output which supplies an output current $I_R$ which is proportional to the reference voltage $U_R$, is connected via two poles to the supply current input I1; I2; I3 of the magnetic field sensor 1a. The output S1; S2 of the magnetic field sensor 1a goes either to the input of the optionally used voltage amplifier 30 or directly to the output of the magnetic field sensor circuit 29. The output of the voltage amplifier 30, if it is present, constitutes the output of the magnetic field sensor circuit 29. The second pole S2 of the output S1; S2 of the magnetic field sensor 1 can be grounded, either virtually or directly.

As can be seen in FIG. 3, the output of the magnetic field sensor circuit 29 and with it also the output of the second magnetic field sensor 1a is connected to the reference voltage input 5; 6 of the converter 4 the output of which in turn constitutes the output of the arrangement according to the invention. The format and the function of the fourth embodiment is similar to the format and function of the third embodiment, with the difference that this time the input voltage of the converter 4 is divided not by the output voltage of the amplifier 3 but by the possibly amplified output voltage of the second magnetic field sensor 1a.

The magnetic field sensor 1 is again subjected to the magnetic field induction $B_N$ to be measured and which, as mentioned earlier, is produced by the current $i_N$. The magnetic field sensor 1a on the other hand is subjected to a magnetic field induction $B_O$ which is either constant or is sinusoidal with constant amplitude. In the first instance the reference voltage $U_R$ is constant and the magnetic field induction $B_O$ is represented by permanent magnets (not shown) or by a coil traversed by a constant direct current. In the second instance however the reference voltage $U_R$ must also be sinusoidal with constant amplitude, whereby $B_O$ and $U_R$ must have an identical frequency.

The two magnetic field sensors 1 and 1a are again made of an identical semiconductor material, e.g. of N-doped material and are insulated from each other electrically on one and the same substrate with nearly identical dimensions as well as with properties that are as identical as possible, in particular with identical doping and preferably with identical dimensions. The geometries of the two magnetic field sensors 1 and 1a can be made very identical in practice on a longterm basis.

The following equations:

$$u_H(n) = (k/n) \cdot i \cdot BN \text{ and}$$

$$u_{H,O}(n) = (k/n) \cdot I_R \cdot B_O$$

apply to both magnetic field sensors 1 and 1a, $I_R$ being the supply current of the magnetic field sensor 1a.

The output voltage $U_V$ of the voltage amplifier 30 is $U_V = v \cdot u_{H,O}$ if v designates the amplification factor of the voltage amplifier 30.

The desired output signal of the converter 4, i.e. the digital output value of the output voltage $u_A$ of the analog/digital converter or the output frequency $f_A$ of the voltage/current converter and therefore the output signal of the arrangement according to the invention is then:

$$M \cdot [U_H/U_V] = M \cdot [u_H/(v \cdot u_{H,O})] =$$

-continued
$$M \cdot [(k/n) \cdot i \cdot B_N]/[v \cdot (k/n \cdot I_R \cdot B_O] = M \cdot [i \cdot B_N]/[v \cdot I_R \cdot B_O],$$

if a proportionality factor M is used, i.e. the desired output signal is again independent of the change $\delta n$ of the charge-carrier concentration n. When the charge-carrier concentration of the magnetic field sensor 1 changes in time from n to n+$\delta n$, the charge-carrier concentration of the second magnetic field sensor 1a also changes from n to n+$\delta n$, so that the desired output signal of the arrangement remains independent of the change $\delta n$ of the charge-carrier concentration n of the magnetic field sensors 1 and 1a.

In order for the two magnetic field sensors 1 and 1a to be subjected to an equal change $\delta n$, they are desirably located as close to each other as possible in the semiconductor material so that they assume an identical temperature. Furthermore they are desirably made with identical depths and by the same method, i.e. with the same process steps in the sensitive volume of the Hall element.

In the cross-section of FIG. 11 the capacitor C1 is to be replaced by the magnetic field sensor 1a. The two magnetic field sensors 1 and 1a are in that case located parallel in an N-doped material. In a further, preferred embodiment (not shown) the two magnetic field sensors 1 and 1a, in order to be magnetically uncoupled, must be arranged so as to be rotated by 90° in relation to each other.

Figure 13:
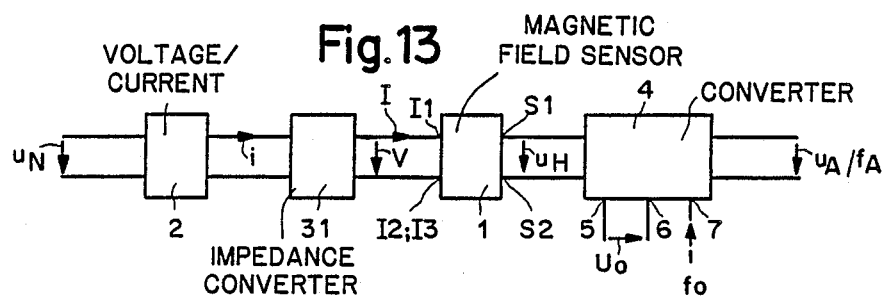
FIG. 13 shows a circuit block diagram of a fifth embodiment of an arrangement for improving the longterm stability of a magnetic field sensor according to the invention.
Figure 14:
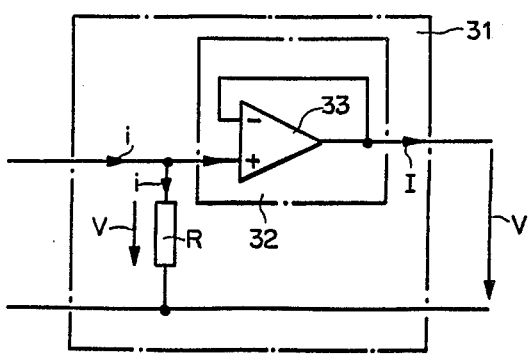
FIG. 14 shows a circuit diagram of an impedance converter.

The fifth embodiment of the arrangement according to the invention shown in FIG. 13 comprises the voltage/current converter 2, an impedance converter 31, the magnetic field sensor 1 and the converter 4, which are connected in series in the sequence indicated. At the reference voltage input 5; 6 of the converter 4 a constant reference voltage $U_O$ is again applied and a constant reference frequency $f_O$ is applied at the reference frequency input 7. The impedance converter 31 comprises, according to FIG. 14, a voltage follower 32 and a resistor R. The resistor R is incorporated by diffusion near the magnetic field sensor 1 into a semiconductor material that is of the same material conductivity type N as that of which the magnetic field sensor is made. The voltage follower 32 comprises an operational amplifier 33 the inverting input of which is directly connected to the output of the operational amplifier 33 and the non-inverting input of which constitutes a first input pole of the impedance converter 31 and is at the same time connected to a first pole of the resistor R, while the output of the operational amplifier 33 is at the same time a first output pole of the impedance converter 31. A second input pole of the impedance converter 31 goes to a second pole of the resistance R and constitutes at the same time a second output pole of the impedance converter 31. The network voltage $u_N$ is connected over two poles to the voltage input of the voltage/current converter 2 whose current output goes via two poles to the input of the impedance converter 31, while the output of the latter is connected via two poles to the supply current input I1; I2; I3 of the magnetic field sensor 1. The resistor R is thus connected via two poles by means of the voltage follower 32 to the supply current input I1; I2; I3 of the magnetic field sensor 1. The sensor output S1; S2 of the magnetic field sensor 1 is applied via two poles to the signal input of the converter 4, whereby the sensor's output pole S2 can be grounded either virtually or directly. The output of the converter 4 constitutes the output of the arrangement according to the invention. The magnetic field sensor is again subjected to the magnetic field induction $B_N$. The resistor R is diffused into the same material, e.g. an N-doped material, of which the magnetic field sensor 1 is made, and can be used for example instead of the capacitor C1 shown in FIG. 11.

The network voltage $u_N$ is transformed by the voltage/current converter 2 into a proportional current i which feeds the resistance R and produces within it a voltage drop V=R.i, said current i being amplified by a factor of one by the voltage follower 32 as it is goes to the current input I1; I2; I3 of the magnetic field sensor 1 in which it produces a supply current I equal to $V/R_E$, whereby $R_E$ designates the input resistance of the current input I1; I2; I3 of the magnetic field sensor 1. In this case the following applies:

$$I = (R/R_E) \cdot i \quad (VIII)$$

Without the presence of a resistor R incorporated by diffusion and of the voltage follower 32 which act as a correction link and as impedance converter 31 in combination with each other, the magnetic field sensor 1 would be supplied directly with current i and its non-compensated output voltage would then be:

$$u_{H,nk}(n) = (k/n) \cdot B_N \cdot i$$

Due to the presence of the impedance converter 31 acting as a correction link and taking equation (VIII) into account, the now compensated output voltage of the magnetic field sensor is:

$$\begin{aligned} u_{H,k}(n) &= (k/n) \cdot B_N \cdot I \\ &= (k/n) \cdot B_N \cdot i \cdot (R/R_E) \\ &= u_{H,nk}(n) \cdot (R/R_E), \end{aligned} \quad (IX)$$

whereby the resistors R and $R_E$ in form of resistors incorporated by diffusion have the following values according to equation II:

R = A/m and $R_E$ = $A_E$/n

Here n designates the charge-carrier concentration of the magnetic field sensor 1, m=p.n the relatively high charge-carrier concentration of the resistor R since a high value is to be selected for p, A the proportionality factor of the resistor R and $A_E$ the proportionality factor of the input resistance $R_E$.

The selected value for p should be at least equal to five, so that the charge-carrier concentration m of the resistance R incorporated by diffusion is at least five times higher than that of the magnetic field sensor 1.

Therefore the following applies:

$(R/R_E) = (A/A_E) \cdot (n/m) = D(n/m)$ where
$D = (A/A_E)$

If the change carrier concentrations n and m change over time to n+$\delta n$ and m+$\delta m$ with $\delta m = \delta n$, then the following relationship applies:

$(R/R_E) = D \cdot [(n+\delta n)/(p \cdot n + \delta n)]$

Since the value selected for p is relatively high, as mentioned earlier, δn can be considered negligible as compared to p.n so that the resistance ratio assumes nearly the following value:

$$(R/R_E) = (D/p) \cdot (1 + \delta n/n).$$

The equation IX the results in:

$$u_{H,k}(n+\delta n) = (D/p) \cdot (1+\delta n/n) \cdot u_{H,nk}(n+\delta nn)$$

The impedance converter 31 is thus used as a correction mechanism in a supply current input circuit 31; 2 of the magnetic field sensor 1 and arranged in such manner that the supply current i of the arrangement as well as the non-compensated output voltage $u_{H,nk}$ of the magnetic field sensor 1 are each multiplied by a factor which is proportional to the factor $(1+\delta n/n)$. The utilization of the correction mechanism thus causes, as desired, the non-compensated output voltage $u_{H,nk}$ of the magnetic field sensor 1 to be multiplied by a factor which is proportional to $(1+\delta n/n)$.

Due to the change of δn in time of the charge-carrier concentrations n and m, the compensated output voltage of the magnetic field sensor 1 is further more equal to:

$$\begin{aligned} u_{H,k}(n+\delta n) &= (D/p) \cdot (1 + \delta n/n) \cdot \\ &\quad [k/(n+\delta n)] \cdot B_N \cdot i \\ &= (D/p) \cdot (1+\delta n/n) \cdot \\ &\quad (k/n)[1/(1+\delta n/n)] \cdot B_N \cdot i \\ &= (D/p) \cdot (k/n) \cdot B_N \cdot i \\ &= (D/p) \cdot u_{H,nk}(n) \end{aligned}$$

The compensated output voltage $u_{H,k}$ of the magnetic field sensor 1 is thus independent of the change δn of the charge-carrier concentration n in the magnetic field sensor 1.

With respect to the construction of the arrangement of the resistor R and of the magnetic field sensor 1 in the fifth embodiment, the same rules and conditions apply in principle as for the construction of the two magnetic field sensors 1 and 1a of the fourth embodiment.

If the converter 4 is a voltage/frequency converter, the transmission ratio of said converter 4; which has a dimension 1/(second.volt) is, as mentioned earlier, also proportional to a reference frequency $f_O$, i.e. the input signal of the converter 4 is multiplied within it by said reference frequency $f_O$ in order to produce the desired signal. As in the third and fourth embodiment where the voltage at the reference voltage input 5; 6 is used to realize the division of the input signal of the converter 4 by a factor which proportional to the factor $(1-\delta n/n)$ or to realize the multiplication of said input signal by a factor which is proportional to $(1+\delta n/n)$, the reference frequency $f_O$ of the converter 4 can also be used in additional embodiments not described here in order to multiply this input signal by a factor $(1+\delta n/n)$. The reference frequency $f_O$ is then no longer constant but must then be produced by means of an oscillator whose frequency is generated accordingly so as to be proportional to this factor as a function of the value of a ratio R1/R2 of two resistances R1 and R2 or by means of a resistive-layer capacitor C1. The reference voltage $U_O$ of the converter 4 is as a rule constant in that case.

Finally, the above-described embodiments of the invention are intended to be illustrative only. Numerous alternative embodiments may be devised without departing from the spirit and scope of the following claims.

We claim:

1. A combination comprising
    a magnetic field sensor, an output signal of said combination being proportional to an output signal of said magnetic field sensor,
    a semiconductor body, a portion of said semiconductor body containing said magnetic field sensor, said magnetic field sensor having a charge-carrier concentration and the output signal of said magnetic field sensor being inverse proportional to said charge-carrier concentration,
    a correction means comprising at least two electrical devices each having impedance value, at least one of said electrical devices being formed in a portion of said semiconductor body and an output signal of said correction means being proportional at least to a first power of a ratio of the impedance values of two of said electrical devices, and
    said correction means being electrically connected to said magnetic field sensor to provide an output signal of said combination which is substantially independent of variations of said charge-carrier concentration.

2. The combination of claim 1 wherein said two electrical devices are resistors, said resistors being formed in a portion of said semiconductor body near said magnetic field sensor, and wherein said ratio of impedance values is the ratio of the resistance values of said resistors, an output signal of said correction means being proportional to the first power of said ratio and the charge-carrier concentration in one of said both resistors being equal to a multiple of the charge-carrier concentration in the other of said both resistors.

3. The combination of claim 2 wherein the charge-carrier concentration in one of both resistors is substantially equal to one-half the charge-carrier concentration of the other of said both resistors, the charge-carrier concentration in said other resistor being substantially equal to said charge-carrier concentration in said magnetic field sensor.

4. The combination of claim 2 wherein said correction means comprises an amplifier, said amplifier having an input which receives a reference voltage and having an amplification factor which is proportional to said ratio of resistance values.

5. The combination of claim 4 wherein said amplifier comprises an inverting amplifier formed using an operational amplifier, one of said both resistors being a feedback resistor connected between the output and an inverting input of said operational amplifier, the other of said both resistors being an input resistor connected to said inverting input of said operational amplifier.

6. The combination of claim 4, wherein said amplifier comprises a first and a second inverting amplifier, said both inverting amplifiers being connected in cascade and formed from first and second operational amplifiers respectively, wherein one of said both resistors is connected as a feedback resistor between the output of said first operational amplifier and an inverting input of said first operational amplifier, wherein the other of said both resistors is connected as an input resistor to an inverting input of said second operational amplifier, wherein a third resistor is connected as an input resistor to said inverting input of said first operational amplifier, and wherein a fourth resistor is connected as a feedback resistor between an output of said second operational amplifier and said inverting input of said second operational amplifier.

7. The combination of claim 1 wherein said two electrical devices are capacitors, at least one of said capacitors being a depletion layer capacitor, said depletion layer capacitor being formed in a portion of said semiconductor body near said magnetic field sensor, and wherein said ratio of impedance values is the ratio of the capacitance of said capacitors, the output signal of said correction means being proportional to the square power of said ratio and the charge-carrier concentration in said depletion layer capacitor being substantially equal to said charge-carrier concentration in said magnetic field sensor.

8. The combination of claim 7 wherein said correction means comprises an amplifier, said amplifier having an input which receives a reference voltage and having an amplification factor which is proportional to the square of said ratio of capacitance values.

9. The combination of claim 8 wherein said amplifier comprises two inverting amplifiers connected in cascade, each of both said inverting amplifiers being formed using an operational amplifier and each comprising a set of two said capacitors, wherein both sets of two capacitors are substantially identical and wherein in each set one of the two said capacitors is a feedback capacitor and the an input capacitor, wherein in each of both said inverting amplifiers said feedback capacitor is connected between the output of said operational amplifier and an inverting input of that operational amplifier, wherein each of said inverting amplifiers further comprises five switches, a first of said switches, said input capacitor and a second of said switches being serial connected and said serial connected devices being connected between an input of said inverting amplifier and the inverting input of its associated operational amplifier, wherein in each of both said inverting amplifiers a third and a fourth of said switches are grounding first and second poles of said input capacitor, respectively, and wherein in each of said inverting amplifiers said feedback capacitor is connected in parallel by the fifth of said switches.

10. The combination of claim 1 wherein said correction means comprises an impedance converter comprising a voltage follower and a resistor located upstream from said voltage follower, wherein said resistor is formed in a portion of said semiconductor body near said magnetic field sensor, wherein the charge-carrier concentration of said resistor is approximately at least five times larger than said charge-carrier concentration in said magnetic field sensor, wherein said impedance converter is supplied by a voltage/current converter with a current, and wherein said resistor is connected via said voltage follower to the supply current input of said magnetic field sensor.

11. The combination of claims 1 or 2 or 3 or 4 or 5 or 6 or 7 or 8 or 9 or 10 wherein said correction means is located in a supply current input circuit of said magnetic field sensor.

12. The combination of claims 1 or 2 or 3 or 4 or 5 or 6 or 7 or 8 or 9 or 10 wherein said combination comprises a multiplier, the output of said correction means being connected to a first input of said multiplier, said multiplier having a second input which is connected to a network voltage and an output which is connected via a voltage/current converter to a supply current input of aid magnetic field sensor.

13. The combination of claims 1 or 2 or 3 or 4 or 5 or 6 or 7 or 8 or 9 wherein said correction means is connected downstream of said magnetic field sensor.

14. The combination of claims 1 or 2 or 3 or 4 or 5 or 6 or 7 or 8 or 9 wherein said combination comprises a converter located downstream of said magnetic field sensor, an output of said correction means being connected to a reference input of said converter.

15. The combination of claims 1 or 2 or 3 or 4 or 5 or 6 or 7 or 8 or 9 wherein said combination comprises a voltage/frequency converter located downstream of said magnetic field sensor, an output of said correction means being connected to reference frequency input of said voltage/frequency converter.

16. The combination of claims 1 or 2 or 3 or 4 or 5 or 6 or 7 or 8 or 9 wherein said combination comprises a converter located downstream of said magnetic field sensor, an output of said correction means being connected to a reference input of said converter, and wherein said correction means comprises an additional magnetic field sensor, said additional magnetic field sensor having approximately the same dimensions as the first magnetic field sensor and being located in a portion of said semiconductor body in close proximity to the first magnetic field sensor.

* * * * *